United States Patent
Miya

(10) Patent No.: US 7,409,657 B2
(45) Date of Patent: Aug. 5, 2008

(54) CLOCK TREE LAYOUT METHOD FOR SEMICONDUCTOR INTEGRATED CIRCUIT

(75) Inventor: Shigeo Miya, Sagamihara (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 262 days.

(21) Appl. No.: 11/243,189

(22) Filed: Oct. 5, 2005

(65) Prior Publication Data

US 2007/0079262 A1    Apr. 5, 2007

(51) Int. Cl.
    *G06F 17/50* (2006.01)
(52) U.S. Cl. .............................................. 716/6; 716/10
(58) Field of Classification Search ............... 716/6, 716/10
    See application file for complete search history.

(56) References Cited

U.S. PATENT DOCUMENTS 6,053,950 A * 4/2000 Shinagawa ..................... 716/2
6,550,045 B1   4/2003 Lu et al.
2003/0005345 A1 * 1/2003 Fletcher et al. .............. 713/401
2004/0210857 A1 * 10/2004 Srinivasan ..................... 716/2

FOREIGN PATENT DOCUMENTS

| JP | 3112843 | 4/1998 |
| JP | 2001-308186 | 11/2001 |
| JP | 2003-316843 | 11/2003 |

* cited by examiner

*Primary Examiner*—Phallaka Kik
*Assistant Examiner*—Aric Lin
(74) *Attorney, Agent, or Firm*—McDermott Will & Emery LLP

(57) ABSTRACT

By executing the steps of sequentially retrieving buffers on a clock tree from a clock source to input pins of the cells other than the buffers and recognizing the buffer retrieved, organizing a group of the buffers recognized on the clock tree into an instance as a hierarchical block and extracting the hierarchical block as a net list, the part constituting the buffers on the clock tree once designed is organized in the hierarchical block and the hierarchical block are saved as the net list as well as the physical arrangement information of an individual buffer. After the circuit modification or net list change have been made, the hierarchical block previously saved is inserted into the net list, and the hierarchical levels are developed after automated arrangement to reproduce the physic arrangement information of the clock tree.

2 Claims, 6 Drawing Sheets

CLOCK TREE LAYOUT METHOD FOR SEMICONDUCTOR INTEGRATED CIRCUIT

BACKGROUND OF THE INVENTION

1. Field of the Invention

This invention relates to a layout method for a semiconductor device, and more particularly to a layout method of a clock tree for shortening the design period of a semiconductor integrated circuit.

2. Description of the Related Art

In recent years, with development of semiconductor technology, large-scaling, complication and high integration of the semiconductor integrated circuit have been advanced. Particularly, in a system LSI in which a large number of soft cores and hard cores are used, the clock system is complicated so that the number of designing man-hours for creating a clock tree in a layout step for the design of semiconductor integrated circuits is increased. This greatly influences a designing schedule.

In the design of the clock tree in recent years, it is an important theme to solve not only reduction of clock skew but also the problems of power consumption, transistor deterioration due to miniaturization, delay error due to process change, etc.

In the design of the clock tree, in order to reduce the changing error in transistors to be used, the number of steps of the clock tree and cell type are made equivalent to implement equivalent-length wirings and equivalent loads. This cannot be implemented easily only by a conventional skew adjusting technique. Thus, the creation of the clock tree entailed considerable labor.

Further, in the layout design of the semiconductor integrated circuit which has been large-scaled and complicated, in many cases, a circuit modification or change is carried out. In order to implement the layout in a short time after a final RTL specification has been determined, generally, provisional layout is implemented before the RTL specification is determined, thereby creating the clock tree.

However, even if the clock tree with low power consumption and tough to changes and crosstalk is designed by consuming considerable labor for the provisional layout and further saved, there has not been proposed an efficient means for reproducing the clock tree having the same technical idea for the circuit re-recomposed after the circuit modification occurs. Therefore where the modification has been made for the RTL, the design of the clock tree must be restructured from the beginning. Thus, the period taken for designing the clock tree in a final layout step becomes equal to the designing period taken for during the provisional layout.

As a countermeasure for such a problem, conventionally, there has been developed a technique for making the design effective by facilitating the skew adjustment by "hardmarco" organization of the clock tree (for example, see Japanese Patent No. 3112843). FIG. 6 is a flowchart showing the process for designing the clock tree according to a prior art.

In FIG. 6, in step 601, circuit design is made. In step 602, the clock inserted in the circuit is "hardmacro" organized. In step 603, forward annotation is performed. If the result is OK, the processing proceeds to the subsequent step 604. If the result is NG, the designing process returns to the circuit design of step 601.

In step 604, blocks of the "hardmacro" in step 603 and step 602 are arranged. In step 605, wiring of automated arrangement is made. In step 606, back annotation is performed. If the result is OK, the designing process is ended. If the result is NG, the designing process returns to the circuit design in step 601 again. By such a clock tree creating method, the skew adjustment is facilitated.

The prior art described above is a technique for minimizing the clock skew. However, if the timing of the circuit cannot be made satisfactory in the back annotation after the arrangement wiring has been made, the process for designing the clock tree must be returned to the circuit designing. Thus, the prior art is not an efficient means for shortening the period from the determination of the final RTL specification to the end of the layout, and so is problematic in the efficiency of design.

Further, in the prior art, since the wiring of the automated arrangement is made after the "hardmacro" has been arranged, the connection between the flip-flops and hard-macro arranged generates wiring disorder so that the clock skew may be deteriorated. Even where the flip-flops to be connected to the "hardmacro" are arranged adjacently to the hardmacro taking the wiring disorder of the clock into consideration, the timing of data path may be deteriorated.

SUMMARY OF THE INVENTION

This invention has been accomplished in order to solve the above problems of the prior art. An object of this invention is to provide a layout method of a clock tree which permits a clock tree once structured to be used without being designed again even when the circuit modification or change occurs after the clock tree has been created by provisional layout during a layout step of a semiconductor integrated circuit so that the time taken for designing the semiconductor integrated circuit can be shortened.

In order to solve the above problem, the clock tree layout method according to this invention comprises the steps of: sequentially retrieving/recognizing buffers on a clock tree from a clock source to input pins of the cells other than the buffers; organizing a group of the buffers recognized on the clock tree into an instance as a hierarchical block; extracting the hierarchical block as a net list; and inserting the hierarchical block in a circuit after a circuit modification or a net list change occurs.

This invention further comprises the steps of: extracting physical arrangement information of the clock tree; and reproducing the physical arrangement of the clock tree using the physical arrangement information after the circuit modification or the net list change occurs.

This invention further comprises the steps of: extracting wiring information of the clock tree; and reproducing the physical arrangement of the clock tree using the wiring information after the circuit change or the net list change occurs.

In this invention, the clock tree is designed using inverters.

In this invention, a clock tree is previously inserted in the semiconductor integrated circuit and a net list with buffer blocks of the clock tree organized hierarchically is automatically arranged.

In this invention, there are a plurality of output pins of a buffer blocks hierarchically organized, and connection between the output pins and connection destination cells is reset so as to minimize a clock skew.

In this invention, clock delay adjustment is carried out for a buffer constituting portion between a desired source point to an input of the hierarchical block in the clock tree.

In accordance with the configurations described above, clock tree information is extracted from RTL information and the clock tree is reproduced using the information previously extracted for a net list after a circuit modification occurs. For this reason, even if the recomposition due to a RTL modification or the circuit modification occurs so that the number of flip-flops and the instance name are changed, as long as the circuit modification is to such a degree that the net name connected to the flip-flops or the cell name on the clock tree is not changed, the clock tree structured by provisional layout can be easily reproduced and used without recomposing the clock tree in a final layout step.

As described above, in accordance with this invention, in designing the clock tree of a semiconductor integrated circuit having a plurality of cells and a complicate clock system in a structure of equivalent-step, equivalent-cell equivalent-length wirings or equivalent loads, even if the circuit modification occurs plural numbers of times, the clock tree once structured can be reproduced without redesigning the clock tree. Even where the number or arrangement of the flip-flops is slightly changed, the drift in the clock skew can be absorbed by reconnection of the flip-flops.

Further, where there is a block in which a great circuit modification occurs, if the clock tree of only this block is restructured and the clock tree of each of other blocks in which a slight circuit modification has occurred is reproduced as it is, the period taken for the layout can be considerably shortened.

DESCRIPTION OF THE PREFERRED EMBODIMENTS

Figure 1:
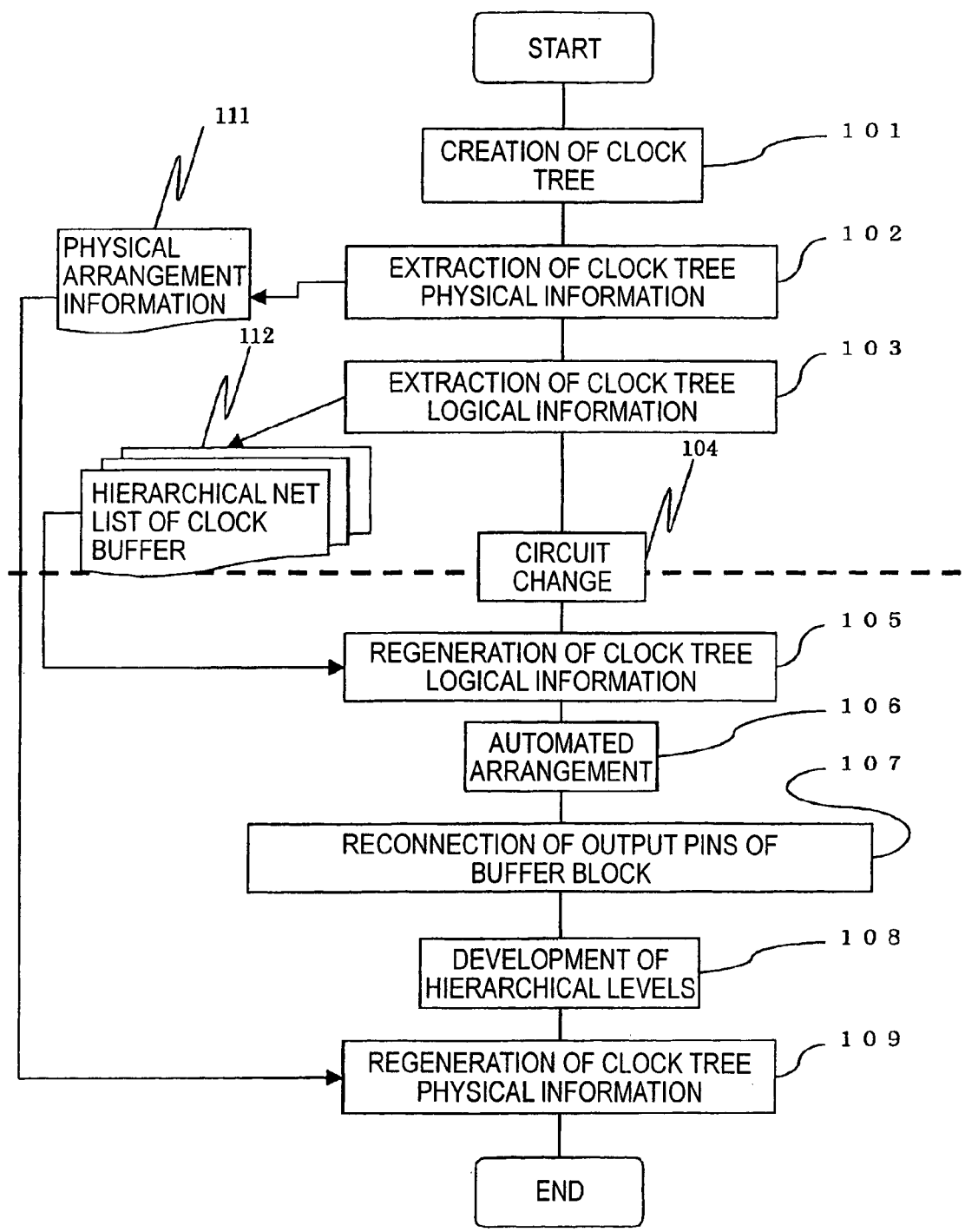
FIG. 1 is a flowchart showing a clock tree layout method for a semiconductor integrated circuit according to an embodiment of this invention.

Now referring to the drawings, an explanation will be given of the best mode for carrying out the invention. In the following description, a typical example of the cell on the side supplied with a clock is a flip-flop; that of the cell other than a buffer and inverter on a clock path is a multiplexer; and that of a clock tree on the clock path is the buffer.

Figure 2:
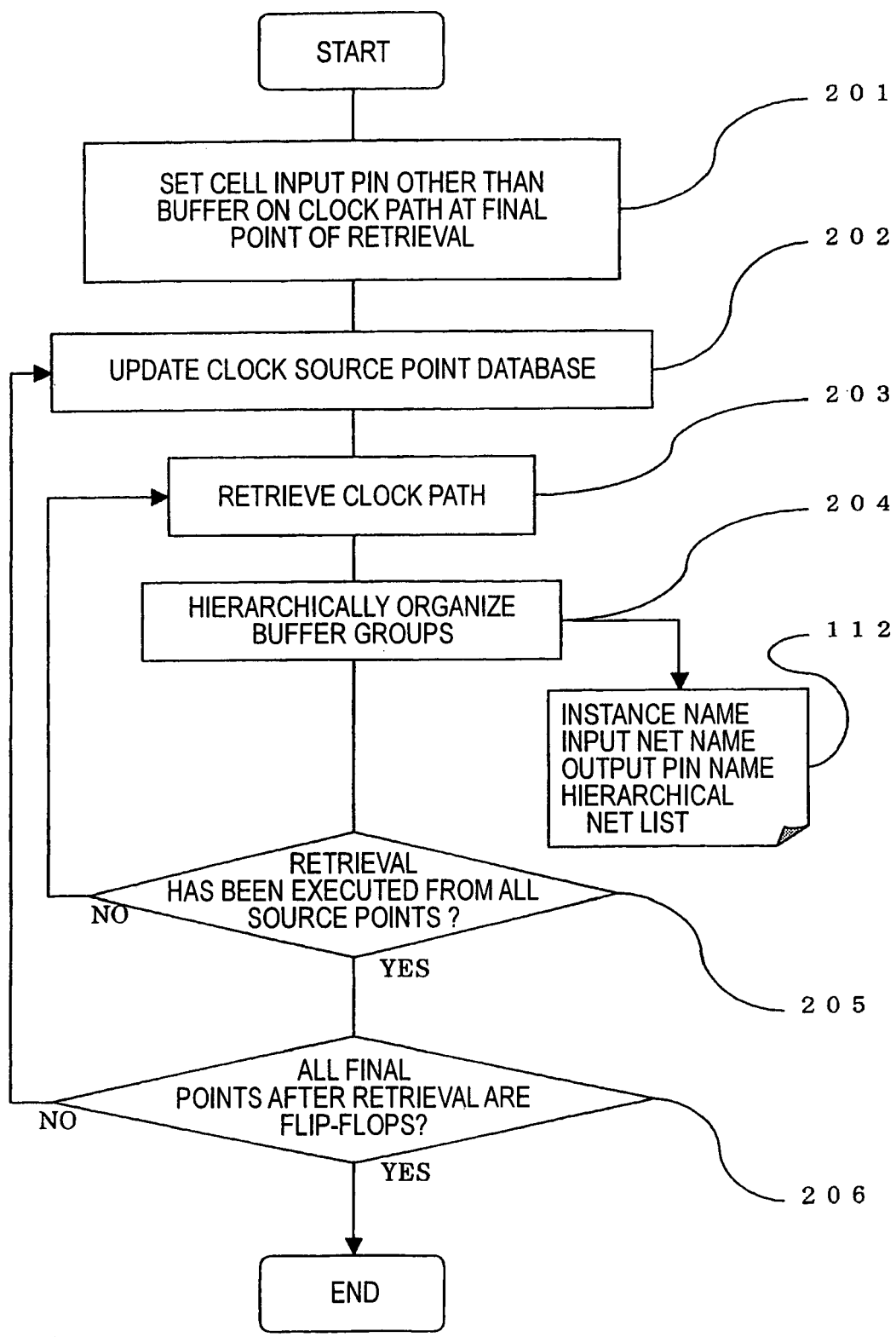
FIG. 2 is a flowchart showing a method for automatically extracting the information of the clock tree according to an embodiment of this invention.
Figure 3:
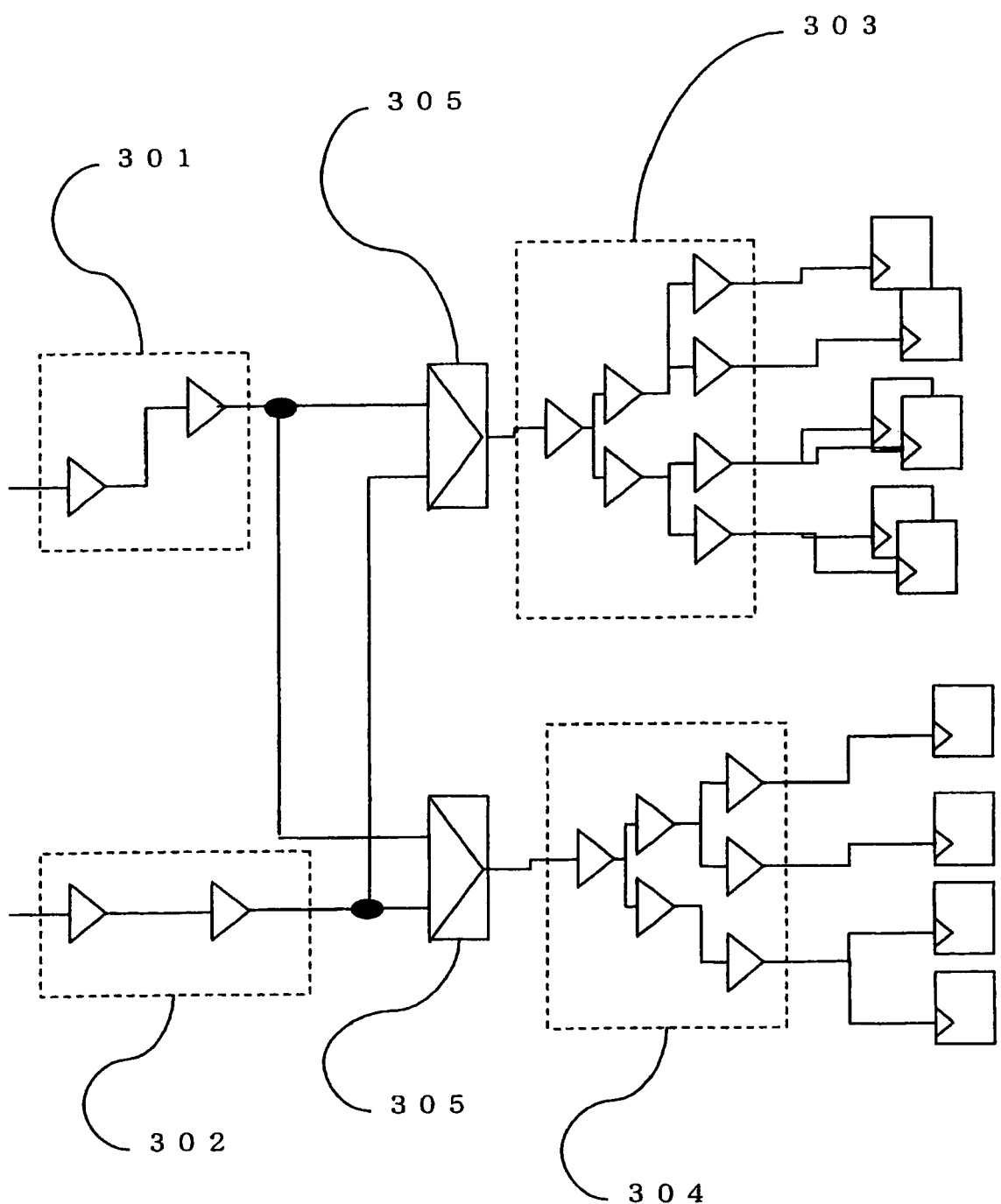
FIG. 3 is a circuit diagram of a typical hierarchical block created in the processing of extracting the information of the clock tree.
Figure 4:
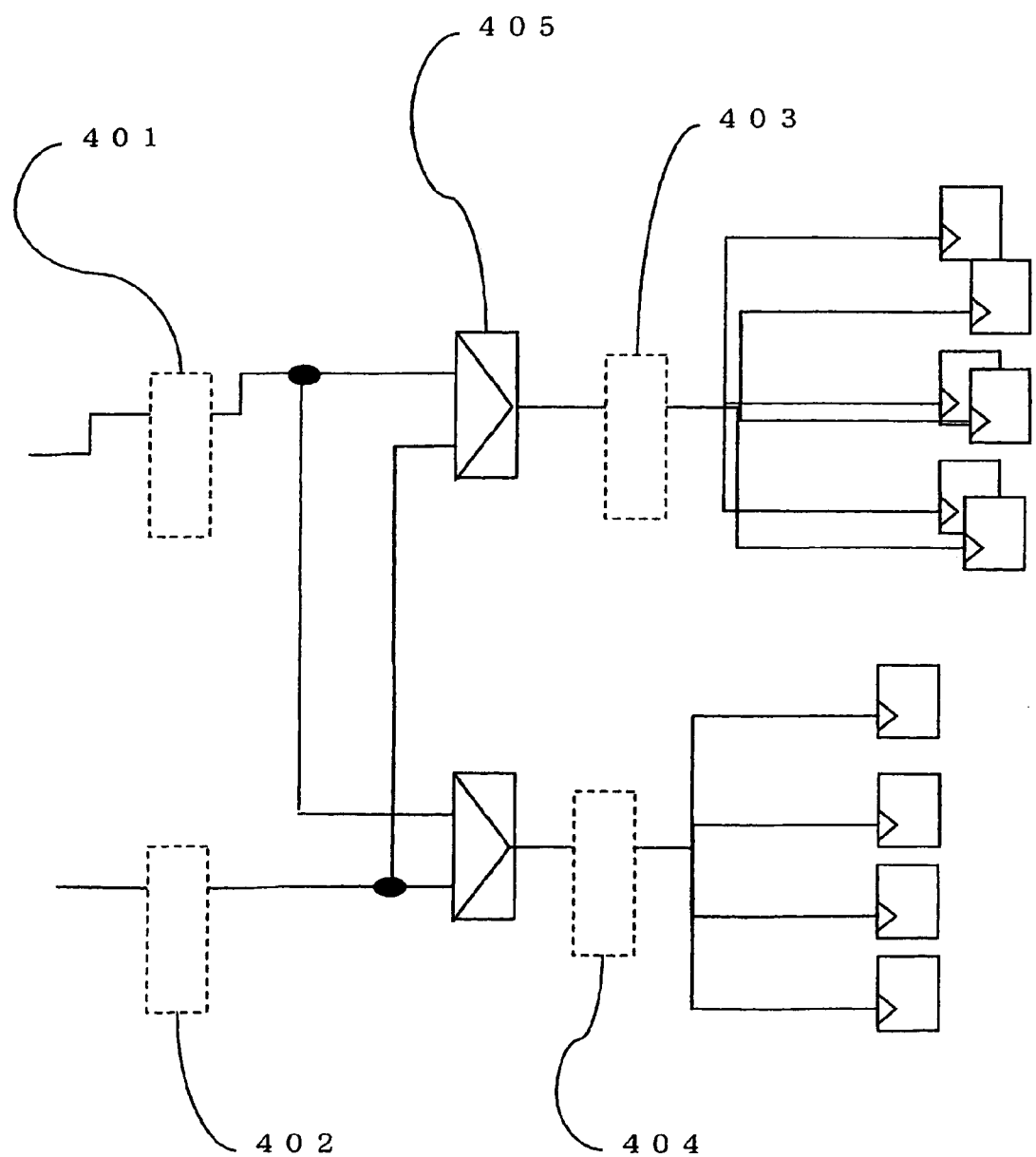
FIG. 4 is a view showing the manner in which the hierarchical block is to be inserted in the clock tree logical information reproducing step.
Figure 5:
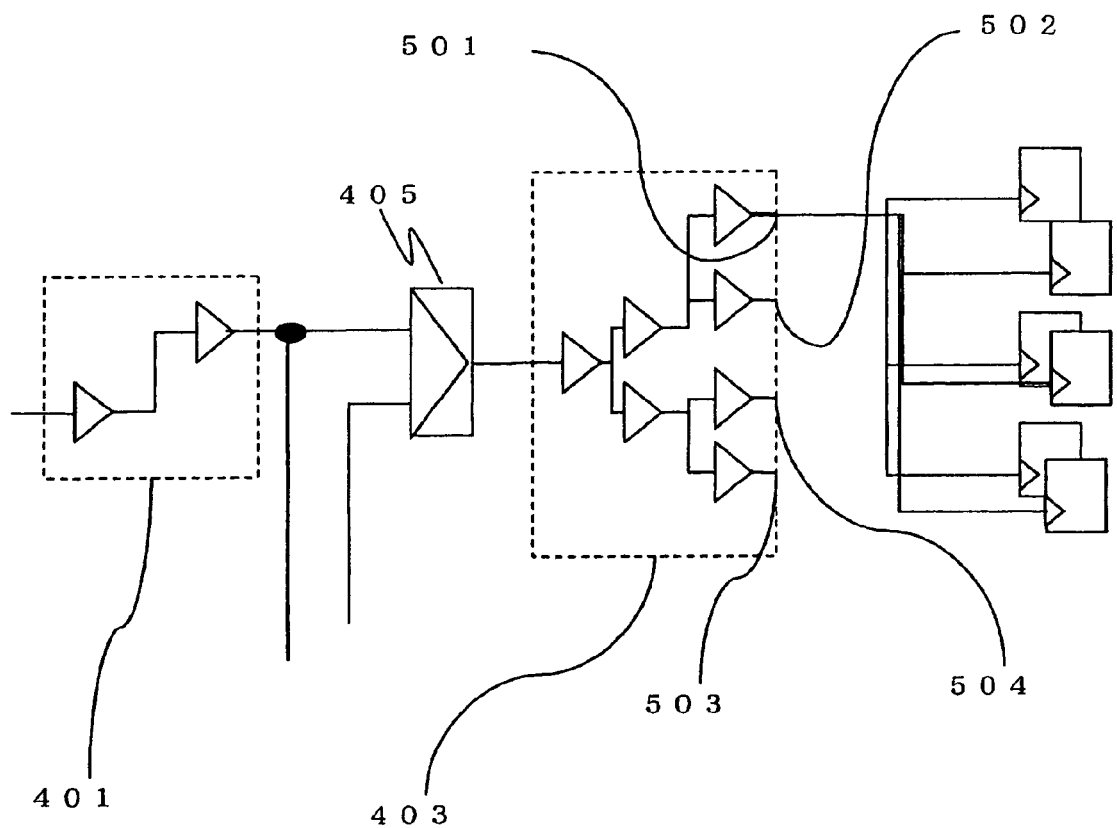
FIG. 5 is a view showing the manner in which the hierarchical block has been inserted in the clock tree logical information reproducing step.
Figure 6:
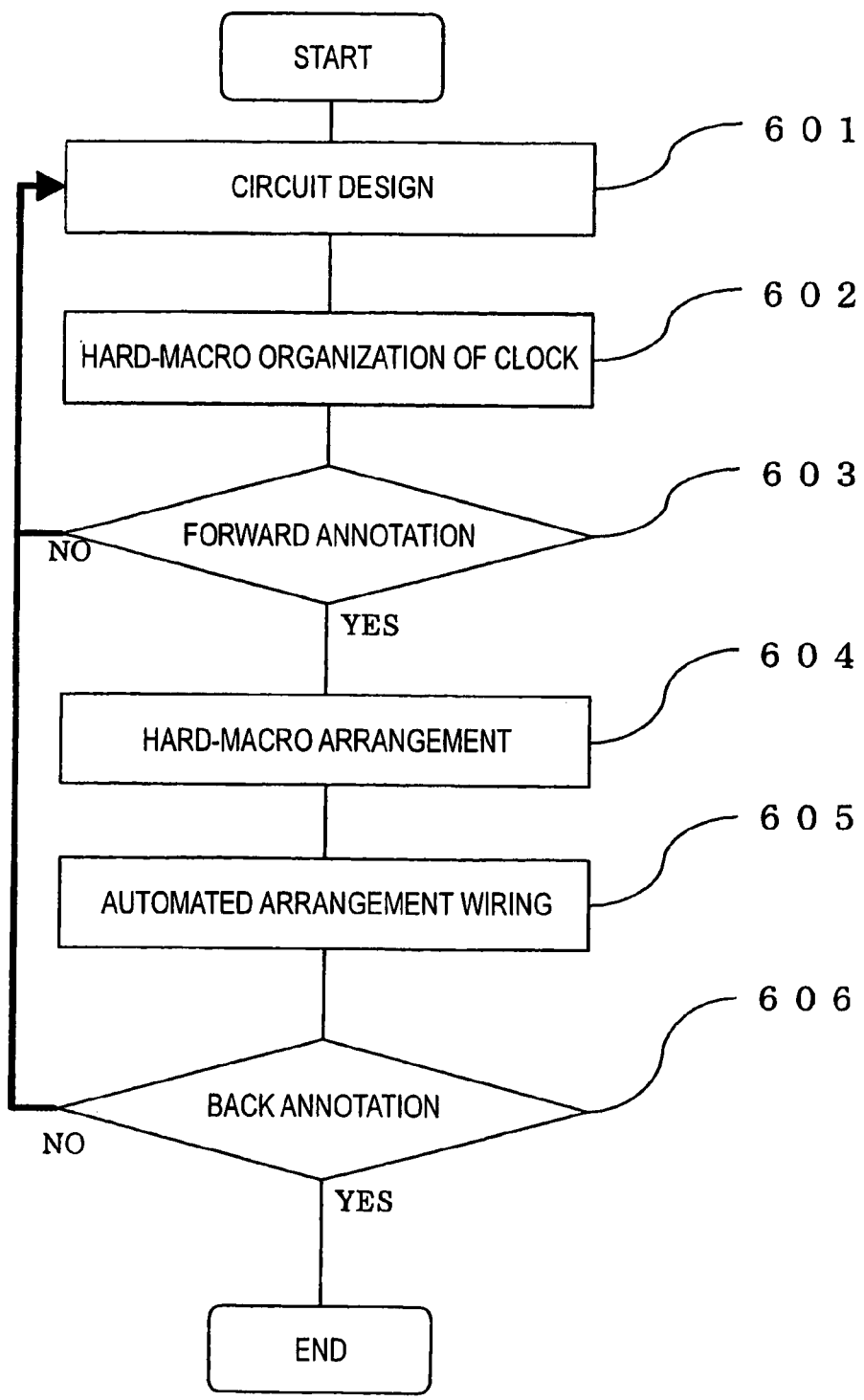
FIG. 6 is a flowchart showing the method for designing a clock tree according to a prior art.

FIG. 1 is a flowchart of a clock tree layout method according to an embodiment of this invention. FIG. 2 is a flowchart for automatically extracting the information of a clock tree in a clock tree layout method for a semiconductor integrated circuit according to an embodiment of this invention. FIGS. 3 to 5 are image views showing the basic concept when the clock tree is inserted as a hierarchical block.

Now referring to FIGS. 1 to 5, an explanation will be given of a method for extracting a clock tree and reproducing the clock tree for a net list after the circuit modification occurs. In FIG. 1, in clock tree creating step 101, a detailed clock tree inclusive of an equivalent step configuration and wiring of a cell arrangement. Next, in clock tree physical information extracting step 102, arrangement coordinate information of buffers and inverters in the clock tree is extracted. The information is stored as a physical arrangement file.

Further, in a clock tree logical information extracting step 103, the group of the buffers and inverters in the clock tree is recognized. The group recognized is saved as a hierarchical block in a logical information file 112 in a net list format. In this case, the information of the net connected to an input pin of the level of the hierarchical block is also saved.

Now referring to the flowchart of FIG. 2, an explanation will be given of the method of automatically extracting the information of the clock tree in the clock tree logical information extracting step.

For the clock tree structured in detail by provisional layout, first, in step 201, the input pins of all the cells other than the buffers on the clock tree are set at a final point of clock tree retrieval processing. Next, in step 202, a retrieval starting point for retrieving the buffers on the clock tree from a clock signal input is set. This point is referred to as a source point.

Further, in clock path retrieval step 203, for a final point of the retrieval processing, the buffers or inverters on the clock tree are retrieved and recognized. If there are a plurality of source points, the clock tree corresponding to the number of the source points is retrieved.

In step 204, the groups of the buffers are hierarchically organized. Specifically, from the list of the clock buffers obtained by the clock tree retrieval processing, a buffer block is created so that an instance name, input net name, output pin name thereof and a hierarchical net list are outputted into a logical information file 112.

Steps 203 and 204 are executed for the source point defined in step 202. In step 205, it is determined whether or not the retrieval has been executed for all the source points. If the retrieval has been executed for all the source points, in step 206, it is determined whether or not all the cells at the retrieved final point are flip-flops. If there is any cell other than the flip-flops, the processing returned to step 202. While the cell other than the flip-flops is set as a new source point, the database is updated. Thereafter, steps 202 to 206 are repeated.

In step 206, if all the cells at the final point retrieved are the flip-flops, it is determined that the retrieval for all the clock trees has been ended, thereby ending the information extracting processing of the clock tree. Through the processing described above, groups of buffers existing on the clock path are outputted as a net of the buffer blocks hierarchically organized.

FIG. 3 is a circuit diagram showing a concrete example of the hierarchical block created in the clock tree information extracting processing as described above. In FIG. 3, reference numerals 301 to 304 denote buffer blocks hierarchically organized. If there are the cells 305 and 306 other than the clock buffers, these cells are not included in the hierarchical blocks.

In FIG. 1, where a circuit modification or change 104 occurs after steps 101 to 103, assuming that there is no change in the clock system other than the clock net to be inputted to the flip-flop, in a clock tree logical information reproducing step 105, the hierarchical blocks saved in the processing to step 103 are inserted.

FIG. 4 is a view showing the manner of inserting the hierarchical blocks in the clock tree logical information reproducing step 105. The buffer blocks 301 to 304 outputted in the processing to step 103, as shown in FIG. 4, are inserted as buffer blocks 401 to 404 on the clock path.

As an inserted example, the processing of the buffer block 403 will be explained. The net connected to the output pins of the cell 405 on the clock path is cut and these pins are connected to one of the output pins of the buffer block 403.

FIG. 5 is a view showing the manner of connecting the clock net to one of the output pins of the buffer block 403 in the clock tree logical information reproducing step 105. In FIG. 5, reference numerals 501 to 504 denote the output pins of the buffer block 403. In this way, in the state where the hierarchical block has been inserted, the net connected to the flip-flops is connected to the one output pin where the remaining output pins are in an opened state.

With such a state being kept, in automated arrangement step 106, automated arrangement is executed. After the automated arrangement, in a buffer-block output pin re-connecting step 107, taking into consideration the wiring disorder so that the skew, power consumption or influence of crosstalk is minimized on the basis of the arrangement information of the flip-flops and others, the output pins of the buffer block are re-connected by distribution. This is repeatedly executed for all the clock tree hierarchical blocks.

After the reconnection, in step 108, all the hierarchical levels are developed. In a clock tree physical information reproducing step 109, with respect to the buffers made flat in step 105, the arrangement of the buffers and inverters on each clock tree is reproduced on the basis of the physical arrangement coordinate information outputted in the clock tree physical information extracting step 102.

As understood from the description hitherto made, even if a circuit change due to re-composition so that the number of flip-flops and instance name are changed for the inserted hierarchical block, the clock tree can be reproduced without creating the clock tree again for the net list after changed. Thus, the period taken for designing the clock tree can be greatly shortened.

The clock tree layout method for a semiconductor integrated circuit according to this invention enables extraction of the clock tree regardless of the complexity of the clock system, and so is useful to shorten the period taken for the final layout in a large-scale and complicate semiconductor integrated circuit.

Since the configuration/arrangement information of the blocks in an individual clock tree is not changed, the clock tree layout method according to this invention can be applied to the use such as wiring reproduction for reducing power consumption or crosstalk in the block.

The clock tree layout method according to this invention can be applied to the use of reproducing the structure of an inter-block delay adjustment buffer where adjustment in the clock delay between the hierarchical blocks is executed only through the buffers and clock delay within the hierarchical block is not changed by the circuit modification.

What is claimed is:

1. A clock tree layout method for a semiconductor integrated circuit, the method, comprising the steps of:
   sequentially recognizing buffers on a clock tree from a clock source to input pins of cells other than the buffers;
   organizing a group of the buffers recognized on said clock tree into an instance as a hierarchical block;
   extracting, from said clock tree, said hierarchical block as a net list; and
   inserting, into said clock tree, said hierarchical block after a circuit modification or a net list change occurs.

2. The clock tree layout method for a semiconductor integrated circuit according to claim 1, wherein said clock tree is designed using inverters.

\* \* \* \* \*